United States Patent
Lim

(10) Patent No.: US 7,883,952 B2
(45) Date of Patent: Feb. 8, 2011

(54) METHOD OF MANUFACTURING FLASH MEMORY DEVICE

(75) Inventor: Hyun-Ju Lim, Mapo-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 273 days.

(21) Appl. No.: 12/146,486

(22) Filed: Jun. 26, 2008

(65) Prior Publication Data
US 2009/0004795 A1    Jan. 1, 2009

(30) Foreign Application Priority Data
Jun. 26, 2007    (KR) .................... 10-2007-0062648

(51) Int. Cl.
*H01L 21/8238*    (2006.01)
(52) U.S. Cl. ................. 438/199; 438/153; 438/154; 257/E21.632; 257/E21.64; 257/E21.678
(58) Field of Classification Search ............... 438/153, 438/154, 199; 257/E21.632, E21.64, E21.678
See application file for complete search history.

(56) References Cited

U.S. PATENT DOCUMENTS

| | | |
|---|---|---|
| 6,503,806 B1 | 1/2003 | Kim |
| 6,815,283 B2 | 11/2004 | Lee |
| 7,067,374 B2 | 6/2006 | Han et al. |
| 2001/0010961 A1 | 8/2001 | Jung et al. |
| 2004/0061169 A1 | 4/2004 | Leam et al. |
| 2005/0048754 A1 | 3/2005 | Yeh et al. |
| 2006/0079060 A1* | 4/2006 | Kwon .................... 438/300 |
| 2006/0183281 A1 | 8/2006 | Cremonesi et al. |
| 2008/0090350 A1* | 4/2008 | Yan et al. ................ 438/257 |
| 2008/0280442 A1* | 11/2008 | Kwak et al. ............. 438/693 |

FOREIGN PATENT DOCUMENTS

CN    1591823    3/2005

* cited by examiner

*Primary Examiner*—Asok K Sarkar
*Assistant Examiner*—Julia Slutsker
(74) *Attorney, Agent, or Firm*—Sherr & Vaughn, PLLC

(57) ABSTRACT

A method of manufacturing a flash memory device that prevents generation of voids when forming an interlayer dielectric film. The method may include forming a gate on a semiconductor substrate, and then sequentially stacking a first dielectric film and a second dielectric film on the semiconductor substrate, and then forming a first spacer comprising a first dielectric film pattern and a second dielectric film pattern on sidewalls of the gate by performing a first etching process, and then forming source and drain areas in the semiconductor substrate, and then removing the second dielectric film, and then sequentially stacking a third dielectric film and a fourth dielectric film on the semiconductor substrate, and then forming a second spacer comprising the first dielectric pattern and a third dielectric pattern on the sidewalls of the gate by performing a second etching process, and then forming an interlayer dielectric film on the semiconductor substrate including the gate and the first spacer.

18 Claims, 4 Drawing Sheets

METHOD OF MANUFACTURING FLASH MEMORY DEVICE

Figure 1:
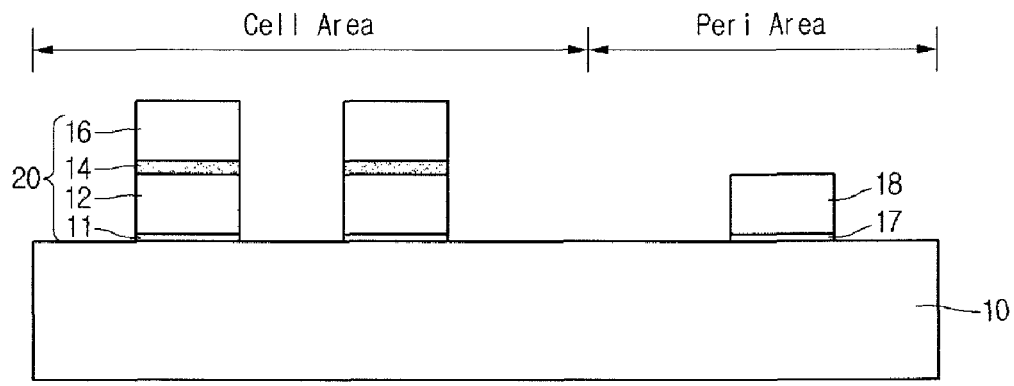

The present application claims priority under 35 U.S.C. §119 to Korean Patent Application No. 10-2007-0062648 (filed on Jun. 26, 2007), which is hereby incorporated by reference in its entirety.

BACKGROUND

Flash memory devices are non-volatile memory media in which stored data is not lost even when power is turned off. Flash memory devices can be advantageous in having a high processing speed when operations are performed such as recording, reading, and deleting, etc. Therefore, flash memory devices have been widely used in data storage for Bios for personal computers (PC), a set-top box, a printer, and a network server, etc. Recently, flash memory devices have widespread application in devices such as digital cameras and cellular phones.

However, as flash memory devices have become more highly integrated, the size of a unit cell of the flash memory is reduced, and in turn, the spatial interval between gate areas forming the unit cell are also reduced so that voids are generated when forming a metal wire.

SUMMARY

Embodiments relate to a method of manufacturing a flash memory device for preventing a generation of voids when forming an interlayer dielectric film.

Embodiments relate to a method of manufacturing a flash memory device including at least one of the following steps: forming a gate on and/or over a semiconductor substrate; and then sequentially stacking a first dielectric film and a second dielectric film on and/or over the semiconductor substrate and forming a first dielectric pattern and a second dielectric pattern on and/or over sidewalls of the gate through a first etching process; and then forming source and drain regions on and/or over the semiconductor substrate; and then removing the second dielectric pattern and forming a third dielectric film on and/or over the semiconductor substrate; and then performing a second etching process on the third dielectric film to form a spacer formed in the first dielectric pattern and the third dielectric pattern on and/or over the gate sidewalls; and then forming an interlayer dielectric film on and/or over the semiconductor substrate formed with the gate and the spacer.

Embodiments relate to a method including at least one of the following steps: forming a gate on a semiconductor substrate; and then sequentially stacking a first dielectric film and a second dielectric film on the semiconductor substrate; and then forming a first spacer comprising a first dielectric film pattern and a second dielectric film pattern on sidewalls of the gate by performing a first etching process; and then forming source and drain areas in the semiconductor substrate; and then removing the second dielectric film; and then sequentially stacking a third dielectric film and a fourth dielectric film on the semiconductor substrate; and then forming a second spacer comprising the first dielectric pattern and a third dielectric pattern on the sidewalls of the gate by performing a second etching process; and then forming an interlayer dielectric film on the semiconductor substrate including the gate and the first spacer.

Embodiments relate to a method including at least one of the following steps: forming a plurality of gates in a cell area of a semiconductor substrate and a gate electrode in a peripheral area of the semiconductor substrate; and then forming first spacers comprising a first dielectric layer and a second dielectric layer on sidewalls of the gates and the gate electrode; and then forming source/drain areas in the semiconductor substrate; and then removing the second dielectric layer to expose the first dielectric layer; and then forming second spacers comprising the first dielectric layer and a third dielectric layer on the sidewalls of the gate and the gate electrode.

Embodiments relate to a method including at least one of the following steps: forming gates spaced apart on a semiconductor substrate; and then forming first spacers comprising a first oxide layer and a first nitride layer on sidewalls of the gates; and then forming source/drain areas in the semiconductor substrate; and then removing the first nitride layer to expose the first oxide layer; and then forming second spacers comprising the first oxide layer and a second nitride layer on the sidewalls of the gate; and then forming silicide layers on the gates and the source/drain areas; and then forming an interlayer dielectric film on the semiconductor substrate including the gates, the silicide layers and the second spacers; and then forming a contact plug extending through the interlayer dielectric film and electrically connected to the gates, the gate electrode and the source/drain areas.

DRAWINGS

Example FIGS. 1 to 11 illustrate a method of manufacturing a flash memory device in accordance with embodiments.

DESCRIPTION

As illustrated in example FIG. 1, gate electrode 18 and gate 20 and are formed on and/or over semiconductor substrate 10 formed having a cell region or area cell area and a peripheral (peri) region or area. In the cell area, gate 20 may be formed including first gate oxide 11, floating gate 12, dielectric film 14 and control gate 16. In the peripheral area, second gate oxide film 17 and gate electrode 18 are formed. Floating gate 12, control gate 16 and gate electrode 18 may be made of polysilicon. Dielectric film 14 may be formed having an oxide-nitride-oxide (ONO) structure for insulating floating gate 12 from control gate 16. Floating gate 12 may serve to store data while control gate 16 may serve to apply bias voltage exciting electrons to floating gate 12 formed below to charge or discharge the electrons.

Figure 2:
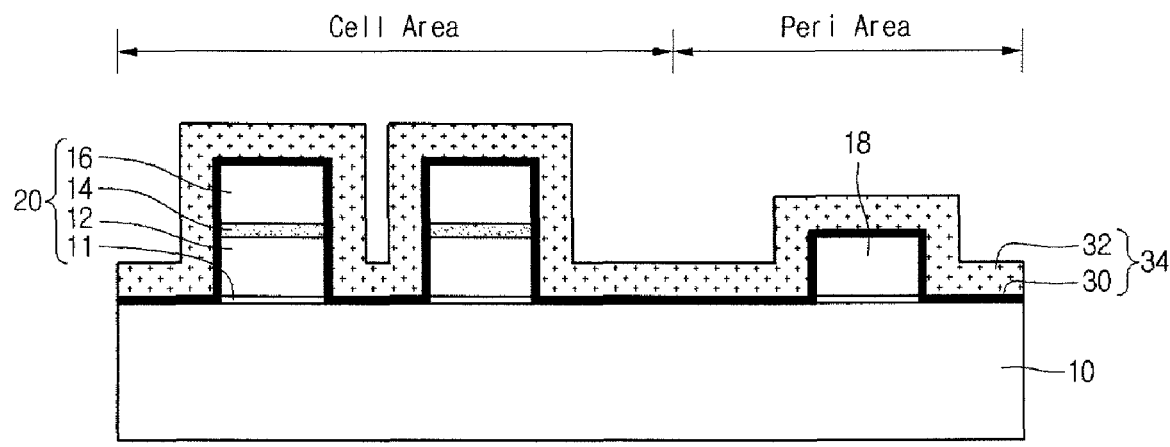

As illustrated in example FIG. 2, spacer film 34 may then be formed on and/or over semiconductor substrate 10 including gate 20 and gate electrode 8. Spacer film 34 may be formed by sequentially stacking first oxide film 30 and first nitride film 32. First oxide film 30 may be formed of tetra ethyl ortho silicate (TEOS) having a thickness in a range between 100 to 300 Å. First nitride film 32 may be formed of silicon nitride (SiN) having a thickness in a range between 500 to 800 Å.

Figure 3:
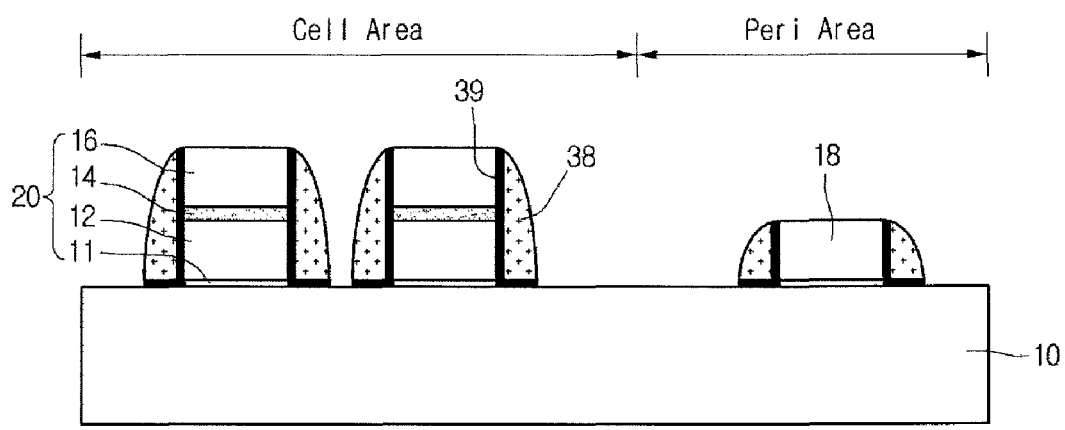

As illustrated in example FIG. 3, spacer film 34 formed in a bi-layer structure may then be subject to an etching process to form a first spacer composed of first oxide film pattern 39 and first nitride film pattern 38 on sidewalls of gate 20 and gate electrode 18. For example, first oxide film pattern 39 may be formed directly against sidewalls of gate 20 and gate electrode 18 and also on and/or semiconductor substrate 10. First nitride film pattern 38 may be formed on and/or over first oxide film pattern 39.

Figure 4:
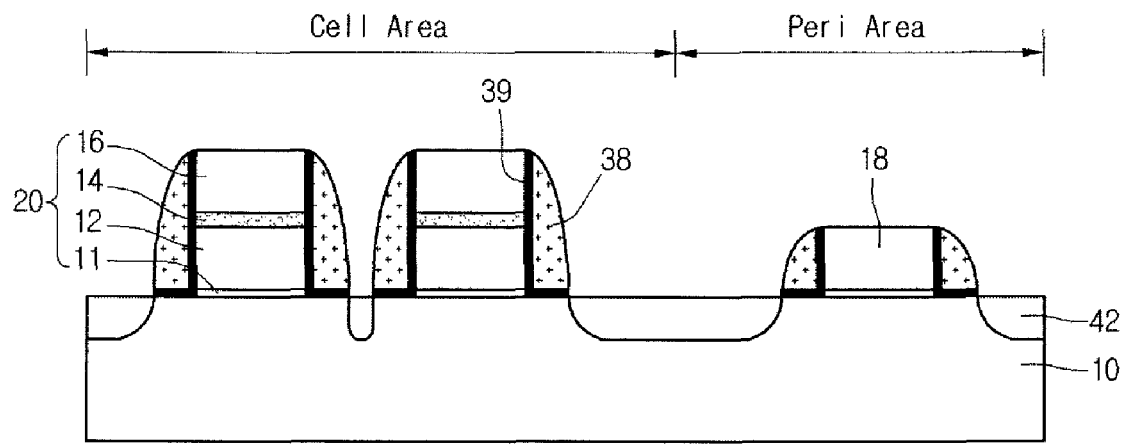

As illustrated in example FIG. 4, an ion-implant process may then be performed using first nitride film pattern 38 as a mask to form source/drain region 42 serving as a high-concentration impurity region or area in semiconductor substrate 10.

Figure 5:
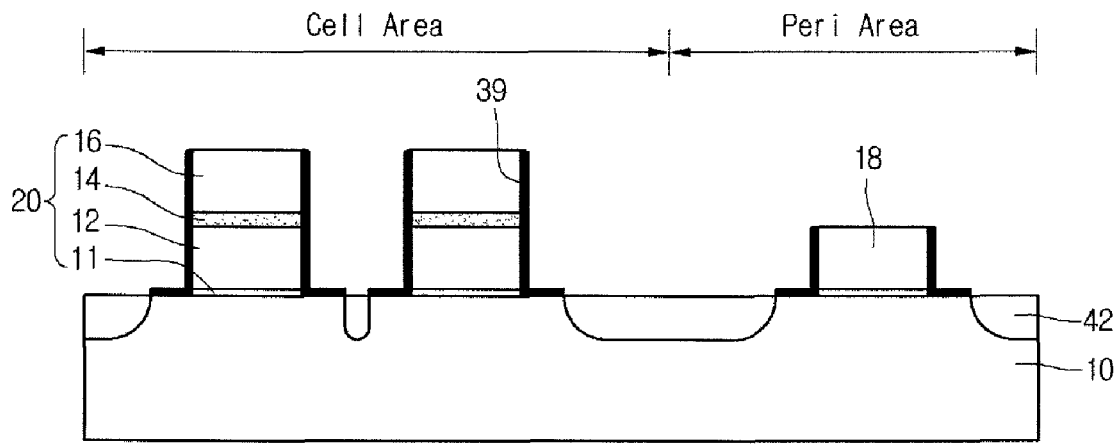

As illustrated in example FIG. 5, first nitride film pattern 38 may then be removed after the ion-implantation process is performed. First nitride film pattern 38 may be removed by performing a wet etching process. The wet etching process may include phosphoric acid ($H_3PO_4$). Removal of first nitride film pattern 38 makes it possible to sufficiently secure a spatial interval between gates 20 formed in the cell area, before forming an interlayer dielectric film. Therefore, generation of voids may be prevented when subsequently forming an interlayer dielectric film and a process margin for forming a contact later may be sufficiently secured. Moreover, a spatial interval between gates 20 may be reduced in accordance with the thickness of the removed first nitride film pattern 38, thereby making it possible to increase integration of the device.

Figure 6:
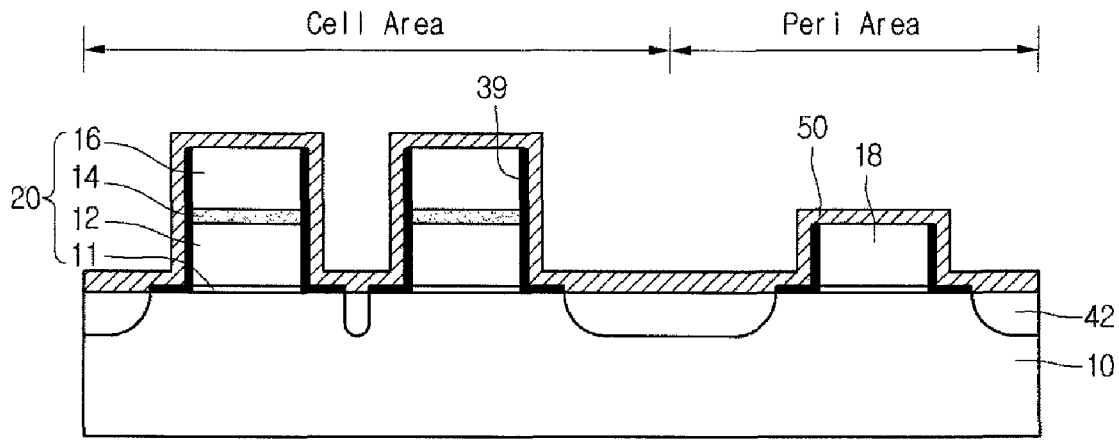

As illustrated in example FIG. 6, second nitride film 50 may then be formed on and/or over semiconductor substrate 10 including gates 20 in the cell area and gate electrode 18 in the peri area. Second nitride film 50 may be made of silicon nitride (SiN) having a thickness in a range of between 70 to 200 Å. Second nitride film 50 may serve to prevent generation of abnormal device property resulting from the subsequent formation of a salicide on and/or over first oxide film pattern 39 through a salicide process. Since there is a process limit in controlling a predetermined amount of nitride film to be maintained during the process removing first nitride film pattern 38, it is a more stable method to perform a re-deposition in a subsequent process.

Figure 7:
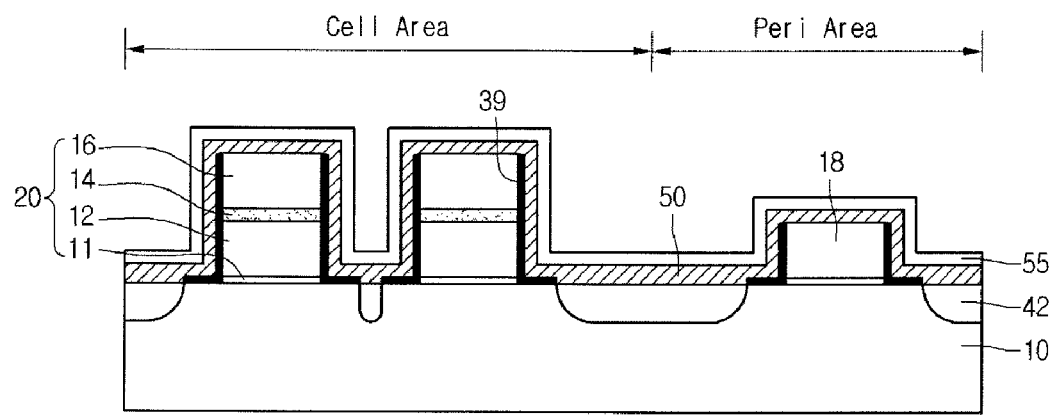

As illustrated in example FIG. 7, second oxide film 55 may then be formed on and/or over second nitride film 50. Second oxide film 55 may be made of TEOS having a thickness in a range of between 360 to 440 Å.

Figure 8:
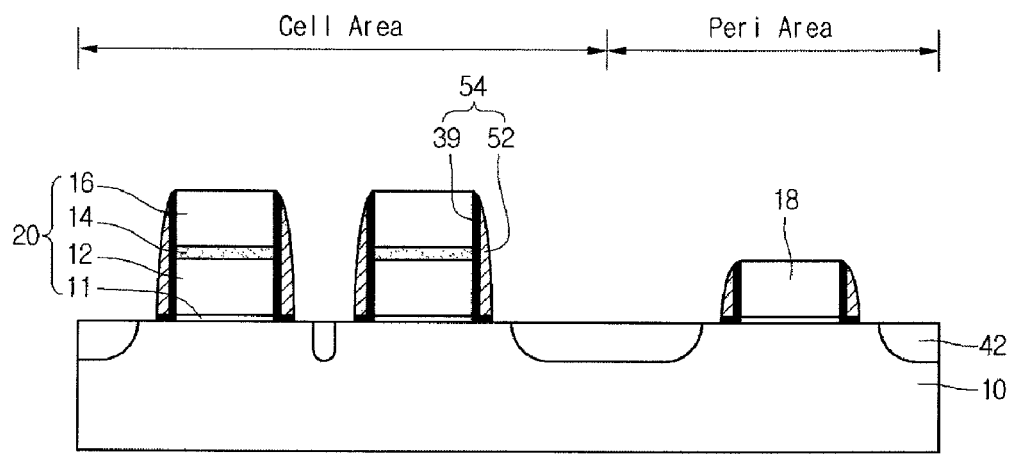

As illustrated in example FIG. 8, an etching process may then be performed on second oxide film 55 and second nitride film 50, thereby forming second spacer 54 composed of first oxide film pattern 39 and second nitride film pattern 52 against the sidewalls of gate 20 and gate electrode 18. During the etching process, a portion of second nitride film 50 and the entire second oxide film 55 formed on and/or over gate 20, gate electrode 18 and source/drain region 42 are removed.

Figure 9:
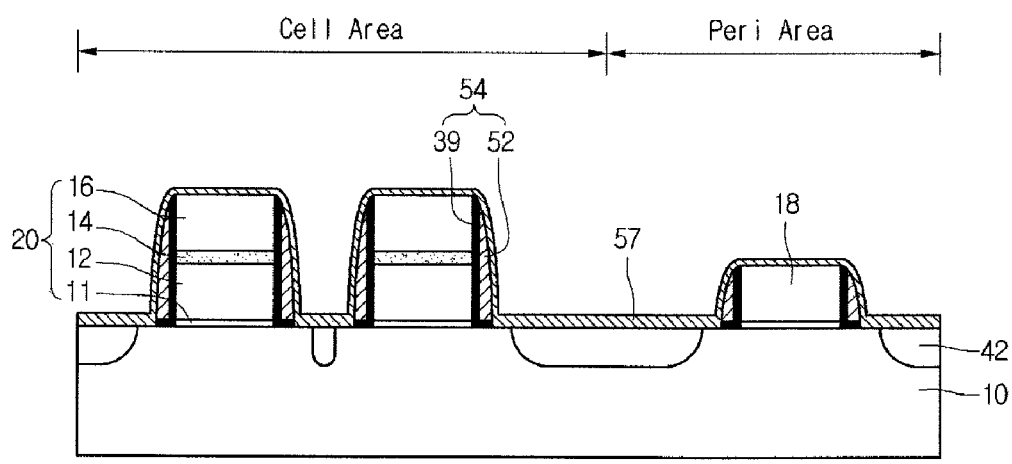

As illustrated in example FIG. 9, silicide-forming metal 57 may then be deposited on and/or over semiconductor substrate 10 including gates 20 formed in the cell area, gate electrode 18 formed in the peri area, spacer 54 and first oxide film pattern 39. Silicide-forming metal 57 may be made of cobalt (Co).

Figure 10:
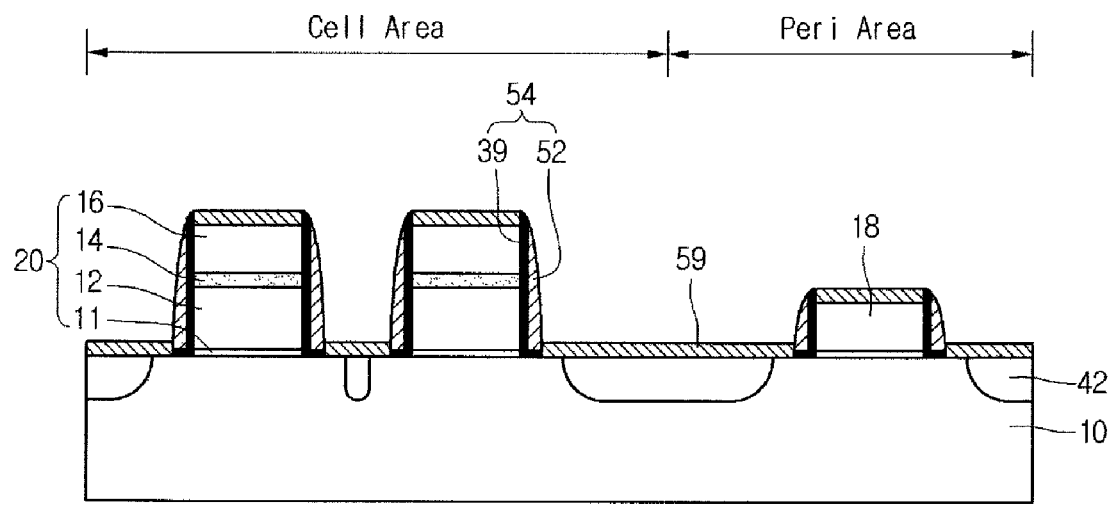

As illustrated in example FIG. 10, an annealing process may then be performed on and/or over semiconductor substrate 10 to induce a reaction between silicon and metal, thereby simultaneously forming metal silicide layer 59 on and/or over the uppermost surface of gates 20, gate electrode 18 and source/drain regions 42, respectively. Through the annealing process, metal silicide layer 59 may be formed only in areas where metal contacts silicon and polysilicon. In turn, metal silicide layer 59 may not be formed in other areas since a reaction between metal and silicon is blocked. After simultaneously forming metal silicide 59 on gates 20, gate electrode 18 and source/drain areas 42, silicide-forming metal 57 not reacted with silicon and polysilicon may be removed through a selective etching process.

Figure 11:
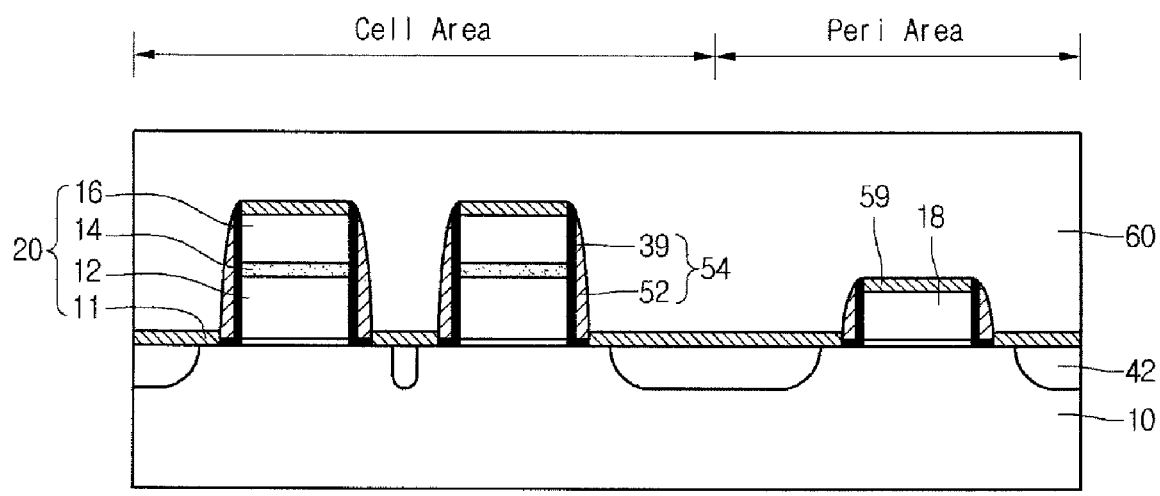

As illustrated in example FIG. 11, interlayer dielectric film 60 may then be formed on and/or over semiconductor substrate 10 including gates 20 formed in the cell area, gate electrode 18 formed in the peri area, spacer 54, first oxide film pattern 39 and metal silicide layer 59. Interlayer dielectric film 60 may be a pre-metal dielectric (PMD) film and be made of at least one of phosphorus silicate glass (PSG), boro-phorphorus silicate glass (BPSG) and undoped silicate glass (USG). In accordance with embodiments, a sufficient space between gates 20 may be secured by removing first nitride film pattern 38 so that voids between gates 20 are not generated when forming interlayer dielectric film 60. At least one via hole may be formed in interlayer dielectric film 60 exposing metal silicide layer 59 by selectively etching interlayer dielectric film 60. A metal layer made of tungsten (W) may then be buried in the via hole to form a contact plug electrically connected to gate 20 and source/drain area 42. In accordance with embodiments, since voids are not generated when forming interlayer dielectric film 60, a diffusion phenomenon due to the void is not generated when forming the contact plug. In turn, the flash memory device can have enhanced performance during operation. Moreover, prevention of void formation also prevents formation of bridges when the contact plug is formed.

In accordance with embodiments, a method of manufacturing a flash memory device secures a sufficient space between gates, thereby making it possible to prevent generation of voids when forming an interlayer dielectric film. Thereby, a bridge between devices due to the removal of the metal layer when forming a contact plug is prevented, making it possible to secure reliability of the flash memory device as well as to realize high integration of the device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:

forming a gate on a semiconductor substrate; and then sequentially stacking a first dielectric film and a second dielectric film on the semiconductor substrate; and then forming a first spacer comprising a first dielectric film pattern and a second dielectric film pattern on sidewalls of the gate by performing a first etching process; and then forming source and drain areas in the semiconductor substrate; and then removing the second dielectric film; and then sequentially stacking a third dielectric film and a fourth dielectric film on the semiconductor substrate; and then forming a second spacer comprising the first dielectric pattern and a third dielectric pattern on the sidewalls of the gate by performing a second etching process, wherein forming the second spacer comprises performing the second etching process removing a portion of the third dielectric film and the entire fourth dielectric film; and then forming an interlayer dielectric film on the semiconductor substrate including the gate and the first spacer.

2. The method of claim 1, wherein removing the second dielectric pattern comprises:

removing the second dielectric film pattern by performing a wet etching process.

3. The method of claim 2, wherein the wet etching process is performed using phosphoric acid ($H_3PO_4$) as an etching solution.

4. The method of claim 1, wherein the first and fourth dielectric films comprise an oxide film and the second and third dielectric films comprise a nitride film.

5. The method of claim 4, wherein the oxide film comprises TEOS and the nitride film comprises SiN.

6. The method of claim 1, wherein sequentially stacking the first dielectric film and the second dielectric film comprises:
sequentially forming the first dielectric film having a thickness in a range between 100 to 300 Å and the second dielectric film having a thickness in a range between 500 to 800 Å.

7. The method of claim 1, wherein sequentially stacking the third dielectric film and the fourth dielectric film comprises:
forming the third dielectric film having a thickness in arrange between 70 to 200 Å and the fourth dielectric film having a thickness in a range between 360 to 440 Å.

8. The method of claim 1, wherein forming the gate includes sequentially stacking a gate oxide film, a floating gate, a dielectric film and a control gate on the semiconductor substrate.

9. The method of claim 1, further comprising, after forming the second spacer and before forming the interlayer dielectric film:
forming a metal layer on the semiconductor substrate including the gate and the second spacer; and then
forming a silicide layer on the gate and the source/drain area by performing an annealing process on the semiconductor substrate.

10. The method of claim 9, wherein the metal layer comprises cobalt.

11. A method comprising:
forming a plurality of gates in a cell area of a semiconductor substrate and a gate electrode in a peripheral area of the semiconductor substrate; and then
forming first spacers comprising a first dielectric layer and a second dielectric layer on sidewalls of the gates and the gate electrode; and then
forming source/drain areas in the semiconductor substrate; and then
removing the second dielectric layer to expose the first dielectric layer; and then
forming second spacers comprising the first dielectric layer and a third dielectric layer on the sidewalls of the gate and the gate electrode, wherein performing the second etching process comprises removing a portion of the third dielectric film and the entire fourth dielectric film.

12. The method of claim 11, wherein forming the first spacers comprises:
forming the first dielectric film against sidewalls of the gate and the gate electrode and on the uppermost surface of the semiconductor substrate; and then
forming the second dielectric film on the first dielectric film; and then
performing a first etching process on the first dielectric film and the second dielectric film.

13. The method of claim 11, wherein forming the second spacers comprises:
forming the third dielectric film on the first dielectric film; and then
forming a fourth dielectric film on the third dielectric film; and then
performing a second etching process on the third dielectric film and the fourth dielectric film.

14. The method of claim 11, further comprising, after forming the second spacers:
forming silicide layers on the gates, the gate electrodes and the source/drain areas; and then
forming an interlayer dielectric film on the semiconductor substrate including the gates, the gate electrode, the silicide layers and the second spacers; and then
forming a contact plug extending through the interlayer dielectric film and electrically connected to the gates, the gate electrode and the source/drain areas.

15. The method of claim 14, wherein forming the silicide layer comprises:
forming a first metal layer on the semiconductor substrate including the gates, the gate electrode and the second spacers; and then
performing an annealing process on the semiconductor substrate.

16. The method of claim 15, wherein forming the contact plugs comprises:
forming via holes in the interlayer dielectric film exposing the silicide layers; and then
forming a second metal layer in the via holes.

17. The method of claim 16, wherein the first metal layer comprises cobalt and the second metal layer comprises tungsten.

18. A method comprising:
forming gates spaced apart on a semiconductor substrate; and then
forming first spacers comprising a first oxide layer and a first nitride layer on sidewalls of the gates; and then
forming source/drain areas in the semiconductor substrate; and then
removing the first nitride layer to expose the first oxide layer; and then
forming second spacers comprising the first oxide layer and a second nitride layer on the sidewalls of the gate, wherein performing the second etching process comprises removing a portion of the third dielectric film and the entire fourth dielectric film; and then
forming silicide layers on the gates and the source/drain areas; and then
forming an interlayer dielectric film on the semiconductor substrate including the gates, the silicide layers and the second spacers; and then
forming a contact plug extending through the interlayer dielectric film and electrically connected to the gates, the gate electrode and the source/drain areas.

* * * * *